(12) United States Patent
Savin

(10) Patent No.: US 8,468,436 B2
(45) Date of Patent: Jun. 18, 2013

(54) MESSAGE-PASSING AND FORCED CONVERGENCE DECODING METHOD

(75) Inventor: Valentin Savin, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 1468 days.

(21) Appl. No.: 12/069,601

(22) Filed: Feb. 11, 2008

(65) Prior Publication Data
US 2008/0195898 A1 Aug. 14, 2008

(30) Foreign Application Priority Data
Feb. 13, 2007 (FR) ...................................... 07 53228

(51) Int. Cl.
*G06F 11/00* (2006.01)

(52) U.S. Cl.
USPC ........................................................ 714/795

(58) Field of Classification Search
USPC ........................................................ 714/795
See application file for complete search history.

(56) References Cited

U.S. PATENT DOCUMENTS

| | | | | |
|---|---|---|---|---|
| 3,835,243 | A * | 9/1974 | Nagaoka ....................... | 348/624 |
| 2006/0066476 | A1 * | 3/2006 | Williams ....................... | 342/175 |
| 2006/0215290 | A1 * | 9/2006 | Kurtas et al. .................. | 360/31 |
| 2008/0045394 | A1 * | 2/2008 | Kolenbrander et al. ......... | 494/7 |
| 2008/0065956 | A1 * | 3/2008 | Blankenship et al. ........ | 714/758 |
| 2008/0086670 | A1 * | 4/2008 | Krouk et al. .................. | 714/752 |

OTHER PUBLICATIONS

French Preliminary Search Report, FA 690503, FR 0753228, dated Sep. 28, 2007.
3GPP TSG RAN WG1 #43 of Nov. 7, 2005: "Rate-Compatible LDPC Codes with Low Complexity Encoder and Decoder".
Berrou, C., et al.: "Near Optimum Error Correcting Coding and Decoding: Turbo-codes", IEEE Trans. Inform. Theory, vol. 44, No. 10, pp. 161-1271, 1996.
Brack et al.: "Disclosing the LDPC Decoder Design Space", Internet Article [online] Mar. 10, 2006.
Chen et al.: "Transactions Papers—Near Optimum Universal Belief Propagation Based Decoding of Low-Density Parity Check Codes", IEE Trans. on Comm., vol. 50, No. 3, Mar. 2002.
Gallager R.: "Low Density Parity Check Codes", IEEE Trans. Inform. Theory, vol. IT-8, pp. 21-28, 1962.
Heo, J.: "Performance and Convergence Analysis of Improved MINSUMiterative Decoding Algorithm", IEICE Trans. Commun.., Oct. 2004.
Ryan, W.E.: "An Introduction to LDPC Codes", CRC Handbook for Coding and Signal Processing for Recording Systems, University of Arizona, Aug. 19, 2003.

(Continued)

*Primary Examiner* — Scott Baderman
*Assistant Examiner* — Jigar Patel
(74) *Attorney, Agent, or Firm* — Nixon Peabody LLP

(57) ABSTRACT

The invention relates to an iterative decoding method of the message-passing type for decoding an error correcting code susceptible of representation by a bipartite graph including a plurality of variable nodes and a plurality of control nodes, said messages being expressed in terms of a log likelihood ratio. At each iteration of a plurality of decoding iterations, for each pair consisting of a variable node and a control node, a change is detected in the sign of the extrinsic information intended to be transmitted ($\alpha_{mn}^{temp}$) as a message by said variable node to said control node relative to that transmitted ($\alpha_{mn}$) at the previous iteration, and in the event of a sign change, said extrinsic information is subjected to an amplitude reduction operation ($F_{red}$) before it is transmitted to the control node.

13 Claims, 4 Drawing Sheets

OTHER PUBLICATIONS

Wiberg, N.: Thesis entitled "Codes and Decoding on General Graphs", 1996.

Zhang, J., et al.: "Shuffled Iterative Decoding", IEEE Trans. on Comm., vol. 53, No. 2, Feb. 2005, pp. 209-213.

* cited by examiner

MESSAGE-PASSING AND FORCED CONVERGENCE DECODING METHOD

CROSS-REFERENCE TO RELATED PATENT APPLICATION OR PRIORITY CLAIM

This application claims the benefit of a French Patent Application No. 07-53228, filed on Feb. 13, 2007, the disclosure of which is incorporated herein in its entirety by reference.

TECHNICAL FIELD

The present invention relates to the decoding of error correcting codes in the telecommunications or data recording fields. To be more precise, the invention relates to a method for iterative message-passing decoding of error correcting codes susceptible of representation by bipartite graphs, such as LDPC (Low Density Parity Check) codes or turbo-codes.

PRIOR ART

Error correcting codes susceptible of representation by bipartite graph cover a wide variety of codes, particularly LDPC codes, initially described by R. Gallager in his article entitled "Low density parity check codes" published in IEEE Trans. Inform. Theory, vol. IT-8, pages 21-28, 1962, the advantageous properties of which have recently been rediscovered, and turbo-codes introduced by C. Berrou et al. in his ground-breaking article "Near optimum error correcting coding and decoding: turbo-codes" which appeared in IEEE Trans. Inform. Theory, vol. 44, No. 10, pages 1261-1271, 1996.

The term bipartite graph is given to an undirected graph in which all nodes are constituted by two disjoint sub-sets such that no two nodes of any one sub-set are connected to each other by an edge of the graph.

Some error correcting codes are susceptible of a representation by bipartite graph. The graph is partitioned into a first sub-set of nodes associated with symbols constituting a code word and a second sub-set of nodes associated with the code constraints, typically with the parity controls. A bipartite graph associated with a group of constraints is also known as a Tanner graph.

The code word symbols are generally elements of the Galois field $F_2=\{0,1\}$, in other words bits, but they can more generally be elements of any characteristic 2 field $F_{2^p}$ and consequently of a $2^p$-ary alphabet. Hereinafter, we shall restrict ourselves with no loss of generality to the case where p=1, i.e. to binary codes.

Codes susceptible of representation by bipartite graphs can be decoded using iterative message-passing decoding, also known as MP (Message Passing) or BP (Belief Propagation). A generic description of this decoding method can be found in the thesis by N. Wiberg entitled "Codes and decoding on general graphs", 1996. Iterative MP decoding is in fact a generalization of algorithms well-known in the decoding area namely the "forward-backward" algorithm used for turbo-codes and the Gallager algorithm for LDPC codes.

In the interest of simplification, we will repeat hereinafter the principle of iterative decoding by message passing in the context of an LDPC code. We consider a linear code (K,N) where K is the dimension of the code representing the number of information bits and N is the length of the code, representing the number of encoded bits. M=N−K corresponds to the number of parity bits or, in an equivalent way, the number of parity constraints.

In FIG. 1 the Tanner graph of a linear code (K,N) has been shown. On the left of the graph the nodes have been set out that correspond to the code bits, further denoted as nodes of the "variable" type or even more simply as "variable" nodes and on the right the nodes corresponding to the parity controls, further denoted as nodes of the "control" type or even more simply as "control" nodes. The incidence matrix of the graph corresponds to the code parity matrix which is of dimension M×N. Thus, the bipartite graph includes N nodes of the "variable" type and M nodes of the "control" type, a variable node n being connected to a control node m if and only if $h_{mn}=1$. For example, the graph in FIG. 1, corresponds to a code (10,5) possessing the following parity matrix:

$$H = \begin{pmatrix} 1 & 1 & 1 & 1 & 0 & 0 & 0 & 0 & 0 & 0 \\ 1 & 0 & 0 & 0 & 1 & 1 & 1 & 0 & 0 & 0 \\ 0 & 1 & 0 & 0 & 1 & 0 & 0 & 1 & 1 & 0 \\ 0 & 0 & 1 & 0 & 0 & 1 & 0 & 1 & 0 & 1 \\ 0 & 0 & 0 & 1 & 0 & 0 & 1 & 0 & 1 & 1 \end{pmatrix}$$

It will be recalled generally that a linear code is defined by a generator matrix G the elements of which are binary values and that a code word $x=(x_1, x_2, \ldots, x_N)$ is obtained from an information bit word $a=(a_1, a_2, \ldots, a_K)$ by means of:

$$x = aG \qquad (2)$$

Since all code words verify the parity controls, we get the relationship:

$$H \cdot G^T = 0 \qquad (3)$$

where $G^T$ denotes the transpose of the matrix G.

The code word x is transmitted on a communication channel or recorded on a data support. On receipt or on reading the support, a noisy version of x is recovered, i.e. $y=(y_1, y_2, \ldots, y_N)$. The decoding operation consists in finding x and therefore a from the observation y.

We will agree on the following notations before describing the iterative message-passing decoding principle:

H(n) denotes all the controls connected to the variable n in the bipartite graph, in other words all the nodes adjacent to the node n;

H(m) is all the variables connected to the control m in the bipartite graph, in other words all the nodes adjacent to the node m;

$\alpha_n$ represents the a priori information relating to the variable n in the bipartite graph, in other words the a priori information relating to the $n^{th}$ bit of the code word. This information takes into account the signal received and the characteristics of the transmission channel. It constitutes the decoder input and is generally supplied by the demodulator in the form of soft values, i.e. in terms of probabilities:

$$\alpha_n = (p_n^0, p_n^1) \qquad (4)$$

where $p_n^a = \Pr(x_n = a | y_n)$, $a \in \{0,1\}$, i.e., more conveniently, in the form of a logarithmic probability ratio, known as a Log Likelihood Ratio or LLR:

$$\alpha_n = \ln\left(\frac{\Pr(x_n = 0 | y_n)}{\Pr(x_n = 1 | y_n)}\right) \qquad (5)$$

Thus, for centred Gaussian white noise (AWGN) and BPSK modulation, the demodulator simply calculates:

$$\alpha_n = \frac{2}{\sigma^2} y_n \quad (6)$$

where $\sigma^2$ is the noise variance.

$\alpha_{mn}$ represents the message transmitted by the variable n to the control m∈H(n). With reference to the turbo-codes, $\alpha_{mn}$ is further known as extrinsic information;

$\beta_{nm}$ represents symmetrically the message transmitted by the control m to the variable n∈H(m). It is also termed extrinsic information;

$\hat{\alpha}_n$ represents the a posteriori information relative to the variable n: it takes into account both the a priori information $\alpha_n$ and the messages $\beta_{nm}$ received by the variable n from its adjacent controls during decoding;

$\bar{\alpha}_n$ is the hard value corresponding to the soft value $\hat{\alpha}_n$, in other words the decision made for the bit $x_n$.

The principle of iterative message-passing decoding is shown in FIG. 2.

At step 210, the messages $\alpha_{mn}$ are initialized, for each variable n and control pair m∈H(n). The messages $\alpha_{mn}$ are generally initialized by the a priori information, in other words: $\alpha_{mn} = \alpha_n$, ∀m∈H(n). The iteration counter Iter is also initialized at 0.

The initialization step is followed by an iteration loop comprising the following steps:

At 220, the controls are processed. To be more precise, for each control m, the messages $\beta_{mn}$ from the control m bound for the respective variables n∈H(m) are calculated, i.e.:

$$\beta_{mn} = F_C(\{\alpha_{mn'} | n' \in H(m) - \{n\}\}) \quad (7)$$

where $F_C$ denotes the control processing function. For any given pair of nodes m, n∈H(m), the message $\beta_{mn}$ is calculated as a function of the messages that the control m has itself received from the variables n'∈H(m)−{n}. It will be noted as a consequence that there is no return of extrinsic information from a variable node to itself. The control processing step is also known as a horizontal step.

At 230, the variables are processed symmetrically. To be more precise, for each variable n, the messages $\alpha_{mn}$ bound for the respective controls m∈H(n) are calculated, i.e.:

$$\alpha_{mn} = F_V(\{\beta_{m'n} | m' \in H(n) - \{m\}\}) \quad (8)$$

where $F_V$ denotes the variable processing function. For a given pair of nodes n, m∈H(n), the message am, is calculated as a function of the messages that the variable n has itself received from the controls m'∈H(n)−{m}, so that, as previously, there is no return of extrinsic information from a node to itself. The variable processing step is also known as a vertical step.

At 240, the a posteriori information $\hat{\alpha}_n$ is estimated from the a priori information $\alpha_n$ and from the messages $\beta_{mn}$ received by the variable n from its adjacent control nodes m∈H(n), which is expressed symbolically as:

$$\hat{\alpha}_n = F_{AP}(\{\alpha_n\} \cup \{\beta_{mn} | m \in H(n)\}) \quad (9)$$

where $F_{AP}$ denotes the a posteriori estimation function.

At 250, a decision is taken in respect of the hard values $\bar{\alpha}_n$ based on the soft values $\hat{\alpha}_n$, i.e.:

$$\bar{\alpha}_n = F_D(\hat{\alpha}_n) \quad (10)$$

where $F_D$ denotes the decision function. Typically, for a BPSK modulation, the decision is taken on the sign of the soft value, in other words $\bar{\alpha}_n = \text{sgn}(\hat{\alpha}_n)$. The value of a bit will be identified hereinafter for reasons of convenience with its modulated value. The bit "0" will conventionally be represented by the value "+1" and the bit "1" by the value "−1".

At 260, a check is made as to whether the vector $\bar{\alpha} = (\bar{\alpha}_1, \bar{\alpha}_2, \ldots, \bar{\alpha}_N)$ is a code word, in other words whether it satisfies the parity controls. If the answer is yes, the loop is quit at 265, the decoded word being $\bar{\alpha}$. If the answer is no, the number of iterations is increased at 267 and at 270 a comparison is made as to whether the number of iterations carried out Iter has reached a threshold value Iter_max. If this is not the case, the iterative decoding is continued by re-looping to step 220. Failing this, the decoding operation is deemed to have failed and it is quit at 275.

The order of the steps in the iteration loop may differ from that disclosed in FIG. 2. In particular, it is possible to reverse the order in which the variables and controls are processed and then start by initializing the messages $\beta_{mn}$:

$$\beta_{mn} = 0, \forall n \in \{1, \ldots, N\} \text{ and } \forall m \in H(n).$$

According to the iterative decoding principle outlined in FIG. 2, all the controls are processed and then all the variables or, as mentioned above, all the variables are processed and then all the controls. This is known as "parallel scheduling" or again as "flooding scheduling". Other types of scheduling have been proposed in the literature; these may be classified into two categories:

serial type scheduling, a category in which the scheduling types denoted "serial scheduling", "shuffled-BP", "horizontal shuffled" or "vertical shuffled" can be placed. Serial type scheduling can be applied to both controls and variables. When applied to controls, decoding uses the following strategy:

a single control m is processed first by calculating the messages $\beta_{mn}$ bound for the variables n∈H(m);

the messages $\alpha_{m'n}$ from each variable n∈E H(m) bound for the controls m'∈H(n)−{m} are updated and transmitted. The a posteriori information $\hat{\alpha}_n$ relative to these same variables is also updated;

the next control is processed and the two previous steps are iterated until the controls are exhausted.

In a dual way, variable by variable processing can be performed instead of control by control processing being performed. Depending on the case envisaged, we will speak of "horizontal shuffled" sequencing or "vertical shuffled" sequencing.

The two aforementioned sequencing types can also be hybridized in the form of "mixed" or "group-shuffled" sequencing. A description of the decoding strategy corresponding to mixed scheduling will be found in the article by J. Zhang et al. entitled "Shuffled iterative decoding" which appeared in IEEE Trans. on Comm., Vol. 53, No. 2, February 2005, pages 209-213. The strategy is based on a partition of the nodes into groups, the processing being in parallel within a group and in series from one group to the next. To be more precise, for a partition in control groups:

a first group G comprising the controls $\{m_1, m_2, \ldots, m_g\}$ is processed by calculating the messages $\beta_{m_i n}$ bound for the variables n∈H($m_i$), for i=1, . . . , g;

the messages $\alpha_{m'n}$ from each variable n∈H($m_i$), i=1, . . . , g bound for the respective controls m'∈H(n)−$\{m_i\}$ are updated and transmitted. The a posteriori information $\hat{\alpha}_n$ relative to these same variables is also updated;

The next group of controls is processed and the two previous steps are iterated until the groups of controls are exhausted.

In a dual way, it is possible to operate on the basis of a partition into groups of variables instead of a partition into groups of controls.

Two main algorithms are known for iterative message-passing decoding in respect of LDPC codes: the SPA (Sum Product Algorithm), further known as "log-BP" and the "Min-Sum" algorithm, further known as "based BP". A detailed description of these two algorithms will be found in the article by W. E. Ryan entitled "An introduction to LDPC codes", published in CRC Handbook for coding and signal processing for recording systems, and available from the link www.csee.wvu.edu/wcrl/ldpc.htm.

SPA and Min-Sum algorithms differ only in the control processing step which will be set out in detail below. The other steps are identical, namely:

Step 230 for processing the variables consists in calculating the messages $\alpha_{mn}$ as follows:

$$\alpha_{mn} = \ln\left(\frac{Pr(x_n = 0 \mid y_n, B^*_{mn}, C_{mn})}{Pr(x_n = 1 \mid y_n, B^*_{mn}, C_{mn})}\right) \quad (11)$$

where $B^*_{mn}$ represents all the messages $\beta_{m'n}$ received by the variable n from the controls m'∈H(n)−{m} and $C_{mn}$ represents the event corresponding to a parity control verified for each of these controls. Subject to the independence of the $y_n$, it is shown that $\alpha_{mn}$ can be expressed in the form of an LLR as:

$$\alpha_{mn} = \alpha_n + \sum_{m' \in H(n)-\{m\}} \beta_{m'n} \quad (12)$$

Step 240 of estimating the a posteriori information comprises calculating:

$$\hat{\alpha}_n = \ln\left(\frac{Pr(x_n = 0 \mid y_n, B_n, C_n)}{Pr(x_n = 1 \mid y_n, B_n, C_n)}\right) \quad (13)$$

where $B_n$ represents the messages received by the variable n from all the controls of H(n) and $C_n$ represents the event corresponding to a parity control verified for each of these controls. On the same assumption as before, it is shown that $\hat{\alpha}_n$ can be expressed in the form of LLR as:

$$\hat{\alpha}_n = \alpha_n + \sum_{m \in H(n)} \beta_{mn} \quad (14)$$

It is noted according to (12) and (14) that:

$$\alpha_{mn} = \hat{\alpha}_n - \beta_{mn} \quad (15)$$

Step 230 of processing variables may consequently be placed at the end of iteration, after the a posteriori information has been estimated The expression (15) conveys the fact that the extrinsic information (here $\beta_{mn}$) sent by a node (m) to itself, is not returned.

Step 250 of hard value decisions is simply achieved by:

$$\bar{a}_n = sgn(\hat{\alpha}_n) \quad (16)$$

where sgn(x)=1 if x is positive and sgn(x)=−1 otherwise.

Parity control verification at 260 in respect of hard values is achieved by calculating the parity controls:

$$c_m = \prod_{n \in H(m)} \bar{a}_n, m = 1, \ldots, M \quad (17)$$

The parity controls are all satisfied if and only if:

$$\sum_{m=1}^{M} c_m = M \quad (18)$$

The controls processing step 220 consists in calculating, for the SPA algorithm:

$$\beta_{mn} = \ln\left(\frac{Pr(c_m = 1 \mid x_n = 0, A^*_{mn})}{Pr(c_m = 1 \mid x_n = 1, A^*_{mn})}\right) \quad (19)$$

where $c_m=1$ signifies a parity condition satisfied for the control m and $A^*_{mn}$ represents all the messages $\alpha_{mn'}$ received by the control m from the variables n'∈H(m)−{n}. It is shown that $\beta_{mn}$ can be expressed as:

$$\beta_{mn} = \left(\prod_{n' \in H(m)-\{n\}} sgn(\alpha_{mn'})\right) \cdot \Phi\left(\sum_{n' \in H(m)-\{n\}} \Phi(|\alpha_{mn'}|)\right) \quad (20)$$

with $\Phi(x) = \ln\left(\frac{e^x+1}{e^x-1}\right) = -\ln\left(\tanh\left(\frac{x}{2}\right)\right)$ Processing the controls according to the Min-Sum algorithm amounts to a simplification of the expression (20). Given the rapid decay of the function $\Phi(x)$ and the equality of $\Phi(x)$ with its reciprocal, i.e. $\Phi(\Phi(x))=x$, the following approximation may legitimately be made:

$$\beta_{mn} = \left(\prod_{n' \in H(m)-\{n\}} sgn(\alpha_{mn'})\right) \cdot \min_{n' \in H(m)-\{n\}}(|\alpha_{mn'}|) \quad (21)$$

The Min-Sum decoding algorithm is substantially more straightforward than the SPA decoding algorithm since it only performs additions, comparisons and changes of sign. Additionally, the performance of the Min-Sum algorithm is independent of the estimation of noise variance $\sigma^2$. In compensation, approximating the values $\beta_{mn}$ according to the expression (21) leads to a loss of performance relative to the SPA decoding algorithm.

Although the SPA decoding algorithm actually performs better than the Min-Sum algorithm, its performance can nonetheless deteriorate markedly in the event of the noise power being wrongly estimated.

Different modified versions of the Min-Sum algorithm have been proposed for the purpose of improving its performance. For example, the aforementioned article by W. E. Ryan brings a corrective term into the approximation (21). The performance of the algorithm so modified is then closer to that of the SPA algorithm but becomes heavily dependent on the noise power estimation error. Additionally, the corrective term substantially increases the decoding complexity. This modified version has been further refined in the document 3GPP TSG RAN WG1 #43 of 7 Nov. 2005, entitled "Rate-compatible LDPC codes with low complexity encoder and decoder". The method disclosed therein consists in bringing a corrective term to (21) only for the δ smallest values $\alpha_{mn'}$, in other words those contributing most to the expression (20). This algorithm remains sensitive however to the noise power estimation error.

The general object of the present invention is to propose an iterative decoding algorithm of the message-passing type that allows an error correcting code susceptible of representation by bipartite graph to be decoded, and that performs better in terms of error rate and convergence speed than the Min-Sum algorithm, without however having the complexity and sensitivity to noise estimation of the SPA algorithm.

DISCLOSURE OF THE INVENTION

The present invention is defined as an iterative message-passing decoding method for decoding an error correcting code susceptible of representation by a bipartite graph including a plurality of variable nodes and a plurality of control nodes, said messages being expressed in terms of a log likelihood ratio. At each iteration of a plurality of decoding iterations, for each pair comprising a variable node and a control node, a change of sign is detected for the extrinsic information intended for transmission as a message by said variable node to said control node relative to that transmitted at the previous iteration, and in the event of a change of sign, said extrinsic information is subject to an amplitude reduction operation before it is transmitted to said control node.

According to a first embodiment alternative, the amplitude reduction operation is a non-linear operation. For example, the amplitude reduction operation is an operation to threshold the absolute value of said extrinsic information relative to a threshold value. Preferably, the threshold value is calculated adaptively.

According to a first law of adaptation example, the threshold value is obtained as the absolute value of the extrinsic information transmitted at the previous iteration from said variable node to said control node.

According to a second law of adaptation example, said threshold value is obtained as the smallest of the absolute values of the extrinsic information transmitted at the previous iterations from said variable node to said control node.

According to a second embodiment alternative, the amplitude reduction operation is a linear operation, for example a multiplication by a coefficient that is strictly positive and strictly less than 1. To advantage, said coefficient is calculated adaptively.

According to a third example, the extrinsic information thresholding operation is followed by a multiplication of the extrinsic information so processed by a coefficient that is strictly positive and strictly less than 1.

Said extrinsic information can be calculated by $\alpha_{mn}^{temp} = \hat{\alpha}_n - \beta_{mn}$ where $\hat{\alpha}_n$ is the a priori value of the variable associated with the variable node with the index n and $\beta_{mn}$ is the message transmitted by the control node with the index m to the variable node with the index n.

The message $\beta_{mn}$ from a control node with the index n to a variable node with the index m can be calculated by:

$$\beta_{mn} = \left( \prod_{n' \in H(m)-\{n\}} \text{sgn}(\alpha_{mn'}) \right) \cdot \min_{n' \in H(m)-\{n\}} (|\alpha_{mn'}|)$$

where $\alpha_{mn'}$ denotes the message from the variable node with the index n' to the control node with the index m, H(m) is the set of the variable nodes adjacent to the control node with the index m, sgn(x)=1 if x is positive and sgn(x)=−1 otherwise.

The invention also relates to a computer program comprising software means adapted to implement the steps in the decoding method disclosed above when it is run on a computer.

DETAILED DISCLOSURE OF PARTICULAR EMBODIMENTS

Further consideration is given to an error correcting code susceptible of representation by a bipartite graph with N variables and M controls. We shall assume hereinafter, for the purposes of illustration and with no loss of generality, that this correcting code is an LDPC code.

The present invention is based on the following statement of fact: when the messages from variables, in other words the extrinsic information values expressed in the form of LLR $\alpha_{mn}$, fluctuate from one iteration to the next or in a general way when they reproduce a fluctuating pattern, the Min-Sum algorithm does not converge or converges only very slowly. The fluctuations in the values $\alpha_{mn}$, are generally due to noise distribution in the word received. The principle of the invention is to damper these fluctuations when they do occur, so as to force the algorithm to enter a convergence status.

Figure 1:
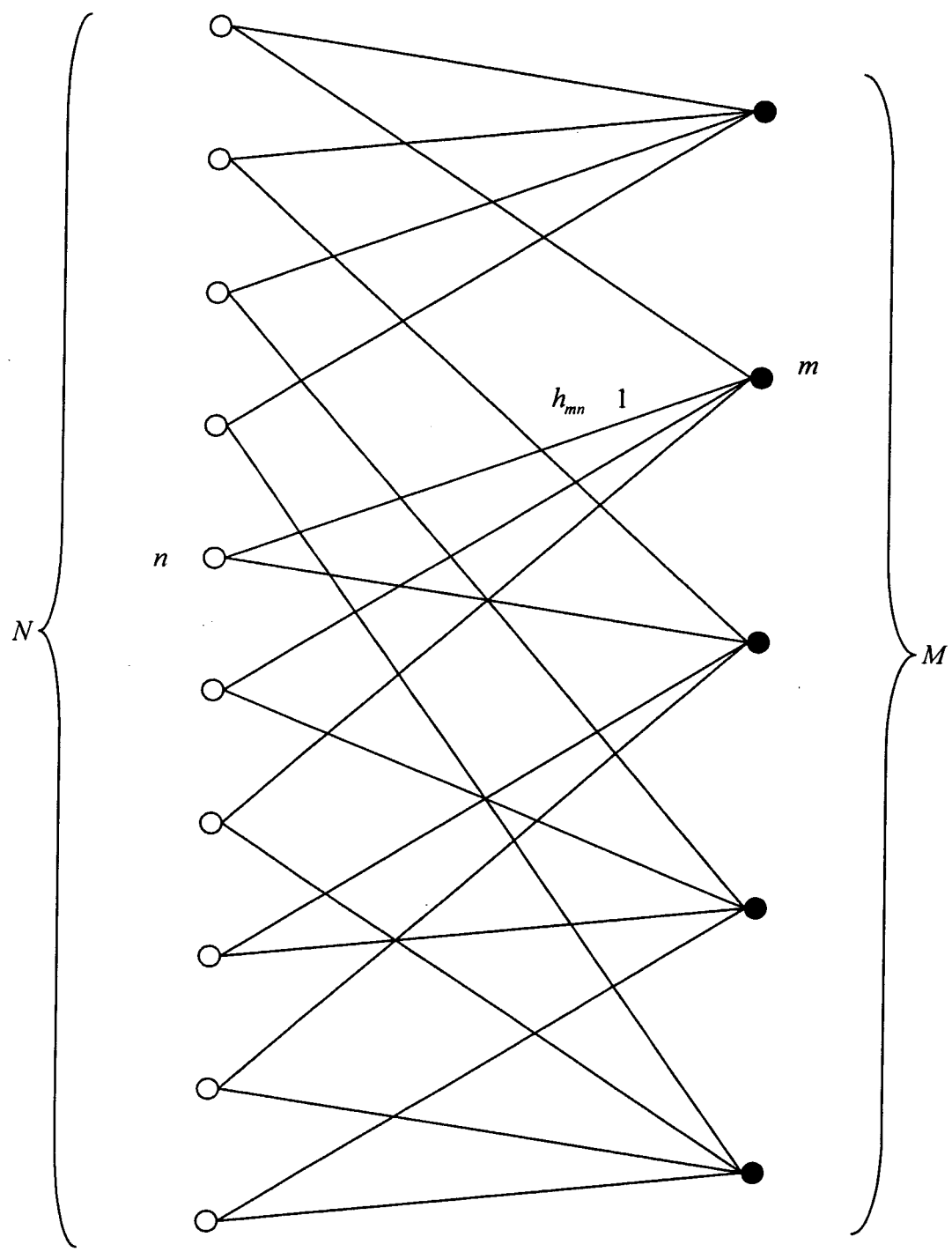
FIG. 1 shows an example of a Tanner graph for a code (K,N)
Figure 2:
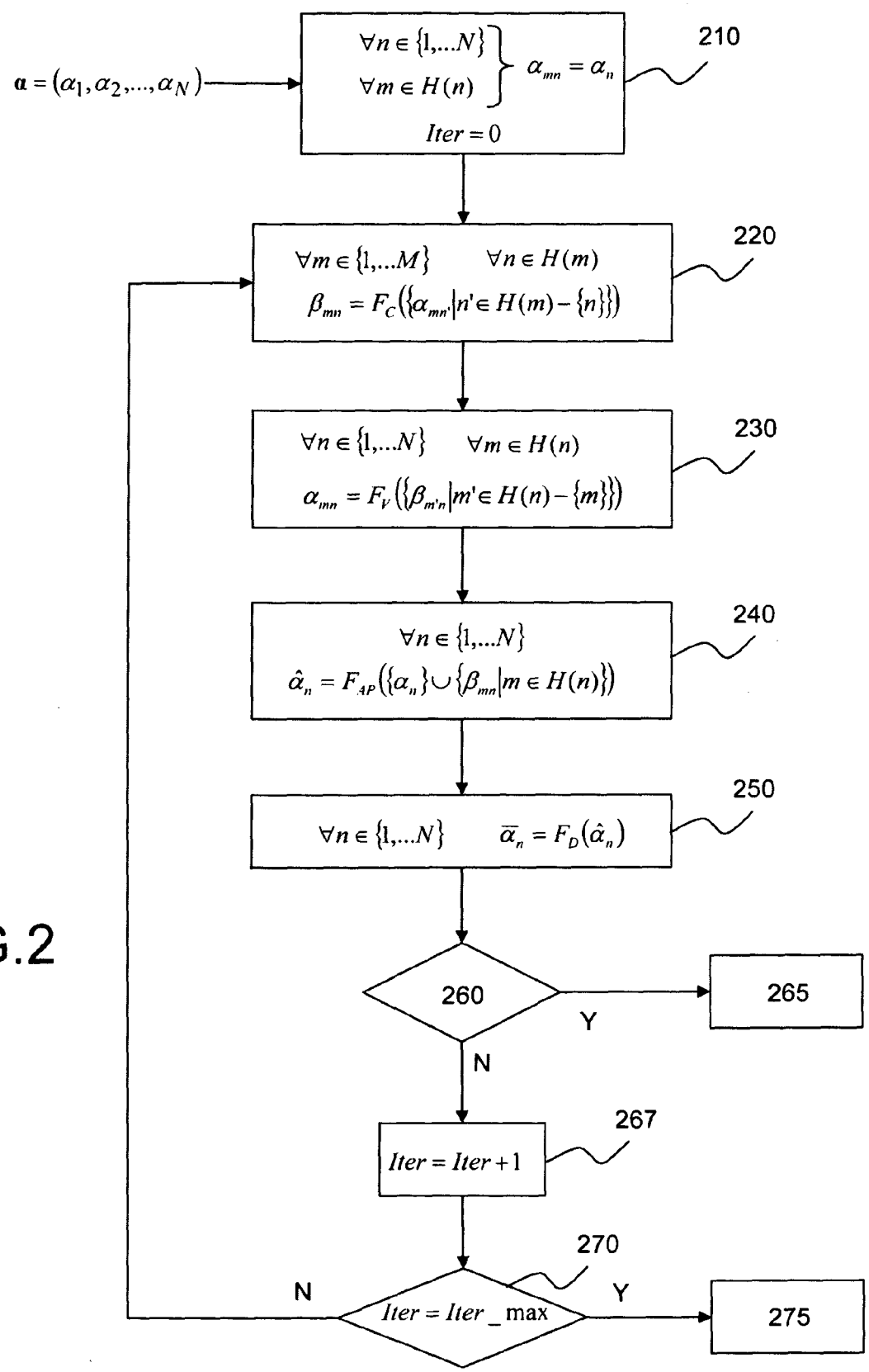
FIG. 2 shows diagrammatically the principle of iterative message-passing decoding known from the prior art.
Figure 3:
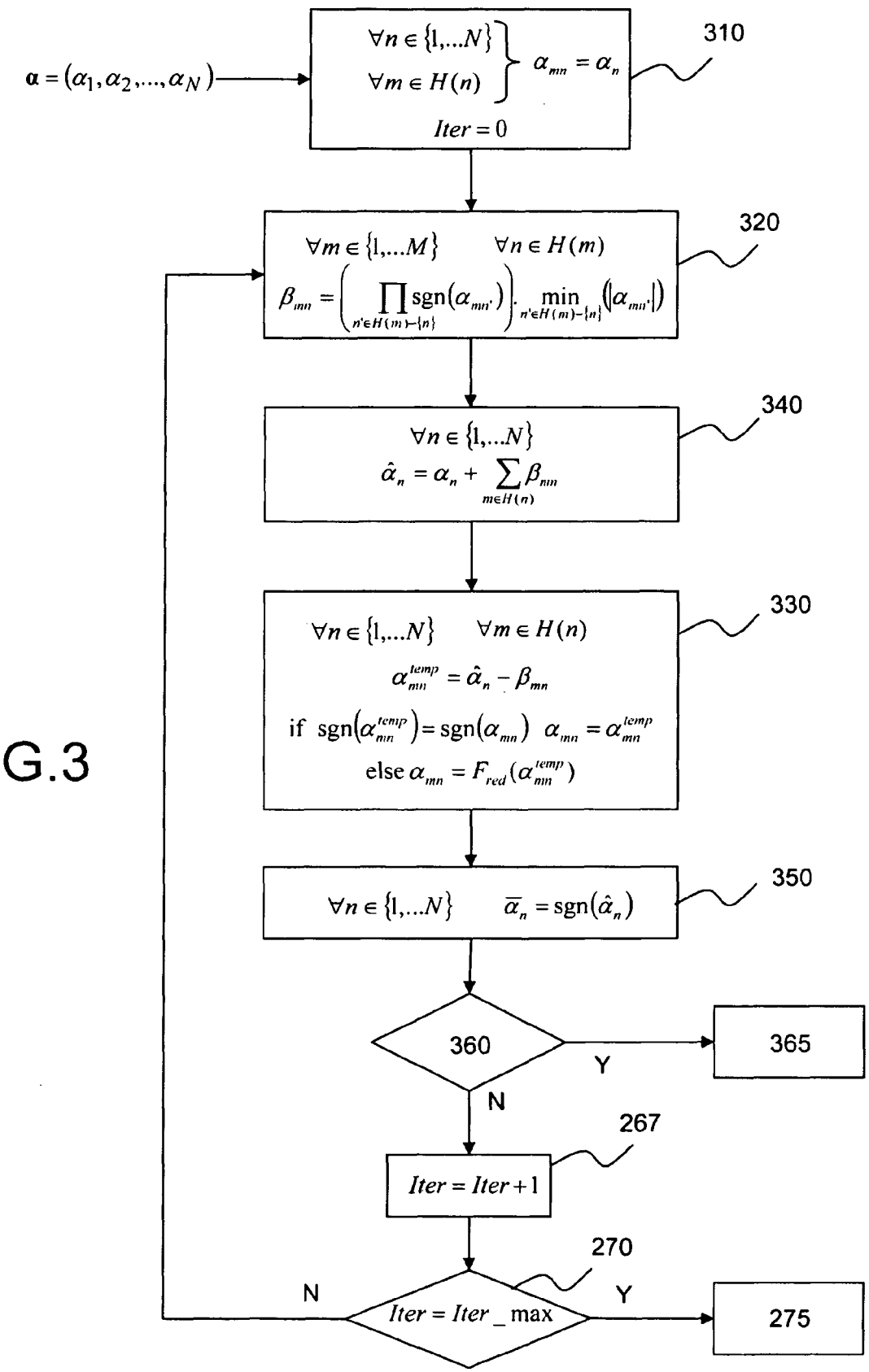
FIG. 3 shows diagrammatically the iterative message-passing decoding method according to one embodiment of the invention.

FIG. 3 represents the decoding process according to one embodiment of the invention. Steps 310, 360, 365, 367, 370 and 375 are identical respectively to steps 210, 260, 265, 267, 270 and 275 in FIG. 2. Step 320 corresponds to step 220 in FIG. 2, wherein the estimation of the messages $\beta_{mn}$ has been explained according to the Min-Sum algorithm, in the expression (21). Step 340 corresponds to step 240 in FIG. 2 wherein the expression (14) of the a posteriori values $\hat{\alpha}_n$ has been explained. Lastly, step 350 corresponds to step 250 in FIG. 2 wherein the decision function expression (16) has been made explicit.

It will be assumed that the extrinsic information values $\alpha_{mn}$ are stored in a table, this table being updated at each iteration.

Step 330 starts with a calculation of the new extrinsic values in form of an LLR from the expression (15) $\alpha_{mn}^{temp} = \hat{\alpha}_n - \beta_{mn}$. However, unlike the conventional Min-Sum decoding process, each value so calculated is first of all stored as an intermediate value before being processed and then stored in the table of extrinsic information values. It will be noted that the processing is conducted sequentially on the values of n and m at 330, so that only one intermediate value is necessary.

The sign of the intermediate value $\alpha_{mn}^{temp}$ is compared with that of $\alpha_{mn}$ already stored, in other words with the sign of the extrinsic information value obtained at the previous iteration and transmitted as a message from the variable node n to the control node m. If these signs are identical, $\text{sgn}(\alpha_{mn}^{temp})=$ sgn($\alpha_{mn}$), there is no oscillation, $\alpha_{mn}$ is refreshed by $\alpha_{mn}=\alpha_{mn}^{temp}$ and this value is transmitted as it is to the control node m.

However, if the two signs are different, sgn($\alpha_{mn}^{temp}$)=−sgn($\alpha_{mn}$), the sign switch conveys a lack of reliability of the value $\alpha_{mn}^{temp}$. This lack of reliability is taken into account by reducing the amplitude of $\alpha_{mn}^{temp}$. $\alpha_{mn}$ is then refreshed with the value so obtained, i.e.:

$$\alpha_{mn}=F_{red}(\alpha_{mn}^{temp}) \quad (22)$$

this value being transmitted to the control node m.

According to a first embodiment alternative, the amplitude reduction operation $|\alpha_{mn}^{temp}|$ is non-linear, for example a thresholding operation. The values $\alpha_{mn}$ are then updated by:

$$\alpha_{mn}=sgn(\alpha_{mn}^{temp})\cdot\min(|\alpha_{mn}^{temp}|,\alpha_{mn}^{T}) \quad (23)$$

where $\alpha_{mn}^{T}$ is a positive threshold value associated with the variable node n and with the control node m. To advantage, the thresholds $\alpha_{mn}^{T}$, $1\leq m\leq M$, $1\leq n\leq N$ are obtained adaptively. To be more precise, they are initialized (at 310) by the absolute values of the a priori information i.e. $\alpha_{mn}^{T}=|\alpha_n|$ and then updated by means of a law of adaptation.

According to a first law of adaptation example, for each node pair (n,m), the current iteration threshold value is equal to the absolute value of the extrinsic information of the previous iteration, in other words the calculation of the expression (23) is preceded by the operation:

$$\alpha_{mn}^{T}=|\alpha_{mn}| \quad (24)$$

Thus, in the event of a sign switch, the amplitude of the message $\alpha_{mn}$ in the current iteration is limited by the absolute value of the message from the previous iteration.

According to a second law of adaptation example, for each node pair (n,m), the threshold value of the current iteration is equal to the smallest absolute value of the extrinsic information from the previous iterations for the same node pair, in other words, step 330 systematically includes a threshold update, as follows:

$\forall n\in\{1,\ldots N\},\forall m\in H(n)$, $\alpha_{mn}^{temp}=\hat{\alpha}_n-\beta_{mn}$ if $sgn(\alpha_{mn}^{temp})=sgn(\alpha_{mn})$ then $\alpha_{mn}=\alpha_{mn}^{temp}$ otherwise $\alpha_{mn}=sgn(\alpha_{mn}^{temp})\cdot\min(|\alpha_{mn}temp|,\alpha_{mn}^{T})$ if $|\alpha_{mn}|<\alpha_{mn}^{T}$ then $\alpha_{mn}^{T}=|\alpha_{mn}|$ (25)

Step 330 can be implemented in this event in an equivalent way by:

$\forall n\in\{1,\ldots N\},\forall m\in H(n)$, $\alpha_{mn}^{temp}=\hat{\alpha}_n-\beta_{mn}$ if $|\alpha_{mn}^{temp}|<\alpha_{mn}^{Min}$ then $\alpha_{mn}^{Min}=\alpha_{mn}^{temp}$ if $sgn(\alpha_{mn}^{temp})=sgn(\alpha_{mn})$ then $\alpha_{mn}=\alpha_{mn}^{temp}$ otherwise $\alpha_{mn}=sgn(\alpha_{mn}^{temp})\cdot\alpha_{mn}^{Min}$ (26)

where $\alpha_{mn}^{Min}$ is the smallest amplitude of the extrinsic information observed for the node pair (n,m).

According to a second embodiment, the amplitude reduction operation is linear (in terms of LLR). In other words, if a sign switch is detected, the amplitude of the extrinsic information is attenuated:

$$\alpha_{mn}=\lambda\alpha_{mn}^{temp} \quad (27)$$

where $\lambda$ is a coefficient such that $0<\lambda<1$. To advantage, for implementation reasons $\lambda=1-2^{-b}$ will be selected with b a strictly positive integer.

The coefficient $\lambda$ may be chosen to be adaptive.

According to a third embodiment, the amplitude reduction operation may be a combination of a linear operation and a non-linear operation, for example a thresholding operation and an attenuation operation as described previously. The extrinsic information is then updated by combining (23) and (27):

$$\alpha_{mn}=sgn(\alpha_{mn}^{temp})\lambda\cdot\min(|\alpha_{mn}^{temp}|,\alpha_{mn}^{T})$$

Other alternative embodiments of the amplitude reduction operation, linear or non-linear, adaptive or not adaptive, are also conceivable without departing from the scope of the present invention. Among non-linear operations origin based sigmoid functions may be of particular use.

The invention has been described for a parallel sequencing starting with the control nodes. It is however clear for the man skilled in the art that it also applies to parallel sequencing starting with the variable nodes. It also applies to serial and hybrid sequencings as defined above.

Figure 4:
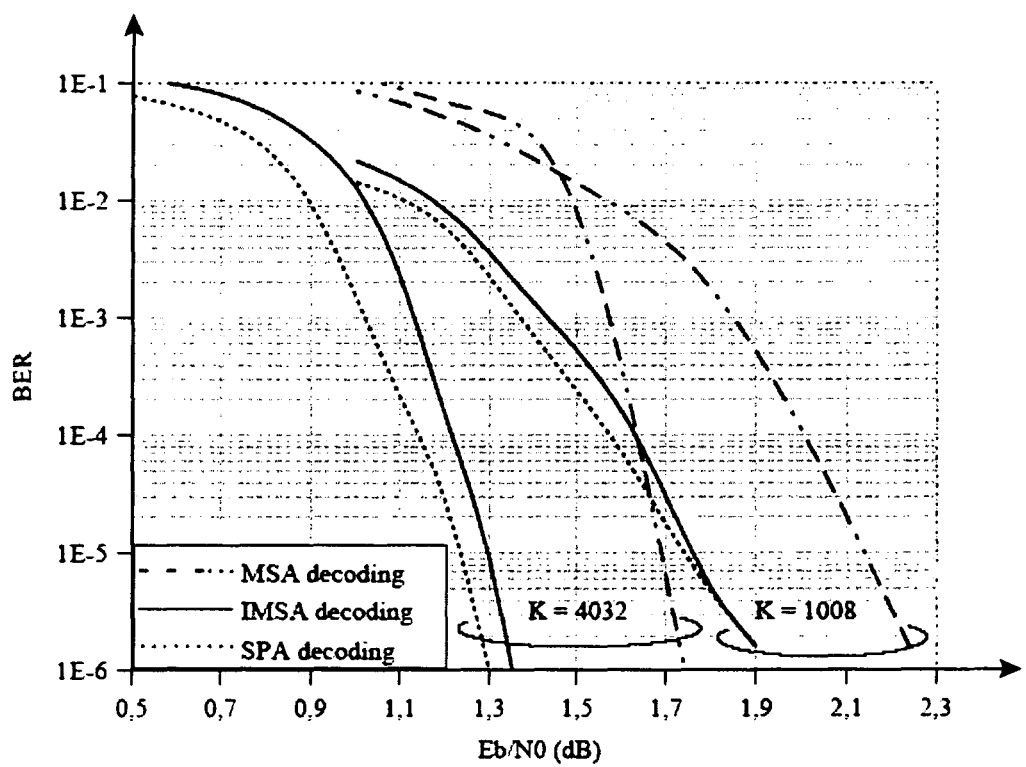
FIG. 4 indicates the error rate obtained by the inventive decoding method in comparison with prior art methods, for two particular LDPC codes.

FIG. 4 can be used to compare the performance in terms of error rates (BER) of conventional Min-Sum and SPA algorithms with the inventive Min-Sum algorithm (IMSA), and for a significant signal-to-noise ratio range. The second example of the law of adaptation of the threshold value, given by the expression (26) has been used here. The number of iterations carried out is equal to 200 in all cases. The two codes used are irregular LDPC codes [1008,2016] and [4032, 8064] and therefore of output ½. The channel has been assumed to be AWGN (Additive White Gaussian Noise) and the modulation is QPSK.

It is noted that the performance of the inventive Min-Sum algorithm is very close to that of the SPA algorithm and is so for a complexity comparable to that of the conventional Min-Sum algorithm.

The present invention applies to the decoding of error correcting codes susceptible of representation by bipartite graphs, particularly LDPC codes or turbo-codes. It can be used in the data recording or telecommunications field, in particular for telecommunications systems that already use LDPC codes, for example those complying with the standards IEEE 802.3a (Ethernet 10 Gbits/s), DVB-S2 (satellite video broadcasting), IEEE 802.16 (WiMAX), or able to use them, for example systems complying with the standards IEEE 802.11 (WLAN) and IEEE 802.20 (Mobile Broadband Wireless Access).

The invention claimed is:

1. Method for operating a decoder decoding an error correcting code susceptible of representation by a bipartite graph including a plurality of variable nodes and a plurality of control nodes, said decoder inputting messages expressed in terms of log likelihood ratio and said decoding being of the message-passing type, characterized in that at each iteration of a plurality of decoding iterations, for each pair consisting of a variable node and a control node, a change is detected in the sign of the extrinsic information intended to be transmitted ($\alpha_{mn}^{temp}$) as a message by said variable node to said control node relative to that transmitted ($\alpha_{mn}$) at the previous iteration, and in the event of a sign change, said extrinsic information is subjected to an amplitude reduction operation ($F_{red}$) before it is transmitted to said control node.

2. Method for operating a decoder according to claim 1, characterized in that the amplitude reduction operation is a non-linear operation.

3. Method for operating a decoder according to claim 2, characterized in that the amplitude reduction operation is an operation to threshold the absolute value of said extrinsic information relative to a threshold value ($\alpha_{mn}^T$).

4. Method for operating a decoder according to claim 3, characterized in that said threshold value is calculated adaptively.

5. Method for operating a decoder according to claim 4, characterized in that the threshold value is obtained as the absolute value of the extrinsic information transmitted at the previous iteration from said variable node to said control node.

6. Method for operating a decoder according to claim 3, characterized in that the threshold value is obtained as the smallest of the absolute values of the extrinsic information transmitted at the previous iterations from said variable node to said control node.

7. Method for operating a decoder according to claim 1, characterized in that the amplitude reduction operation is a linear operation.

8. Method for operating a decoder according to claim 7, characterized in that the amplitude reduction operation is a multiplication by a coefficient that is strictly positive and strictly less than 1.

9. Method for operating a decoder according to claim 8, characterized in that said coefficient is calculated adaptively.

10. Method for operating a decoder according to claim 3, characterized in that the operation to threshold the extrinsic information is followed by a multiplication of the extrinsic information so processed by a coefficient that is strictly positive and strictly less than 1.

11. Decoding method for operating a decoder according to claim 1, characterized in that said extrinsic information is calculated by $\alpha_{mn}^{temp} = \hat{\alpha}_n - \beta_{mn}$ where $\hat{\alpha}_n$ is the a posteriori value of the variable associated with the node with the index n and $\beta_{mn}$ is the message transmitted by the control node with the index m to the variable node with the index n.

12. Method for operating a decoder according to claim 1, characterized in that the message $\beta_{mn}$ from a control node with the index n to a variable node with the index m is calculated by:

$$\beta_{mn} = \left( \prod_{n' \in H(m) - \{n\}} \operatorname{sgn}(\alpha_{mn'}) \right) \cdot \min_{n' \in H(m) - \{n\}} (|\alpha_{mn'}|)$$

where $\alpha_{mn'}$ denotes the message from the variable node with the index n' to the control node with the index m, H(m) is the set of the variable nodes adjacent to the control node with the index m, sgn(x)=1 if x is positive and sgn(x)=−1 otherwise.

13. A non-transitory storage medium storing a computer program for controlling a computer to carry out the method for operating a decoder according to claim 1.

* * * * *